United States Patent
Yoon et al.

(10) Patent No.: US 8,687,424 B2
(45) Date of Patent: Apr. 1, 2014

(54) NAND FLASH MEMORY OF USING COMMON P-WELL AND METHOD OF OPERATING THE SAME

(75) Inventors: Han-Sub Yoon, Gyeonggi-Do (KR); Jong-Suk Lee, Lexington, MA (US); Kae-Dal Kwack, Seoul (KR)

(73) Assignee: Intellectual Discovery Co., Ltd., Seoul (KR)

( * ) Notice: Subject to any disclaimer, the term of this patent is extended or adjusted under 35 U.S.C. 154(b) by 177 days.

(21) Appl. No.: 13/063,274

(22) PCT Filed: Sep. 9, 2009

(86) PCT No.: PCT/KR2009/005098
§ 371 (c)(1),
(2), (4) Date: May 23, 2011

(87) PCT Pub. No.: WO2010/030110
PCT Pub. Date: Mar. 18, 2010

(65) Prior Publication Data
US 2011/0216595 A1 Sep. 8, 2011

(30) Foreign Application Priority Data

Sep. 10, 2008 (KR) .................. 10-2008-0089407

(51) Int. Cl.
*G11C 16/04* (2006.01)

(52) U.S. Cl.
USPC ................................ 365/185.17; 365/185.18

(58) Field of Classification Search
USPC ............................ 365/185.17, 185.18, 185.15
See application file for complete search history.

(56) References Cited

U.S. PATENT DOCUMENTS

| | | | |
|---|---|---|---|
| 6,005,804 A * | 12/1999 | Hollmer et al. | 365/185.17 |
| 6,587,382 B1 | 7/2003 | Estakhri et al. | |
| 6,614,070 B1 * | 9/2003 | Hirose et al. | 257/316 |
| 6,768,671 B1 | 7/2004 | Lee et al. | |
| 2002/0158282 A1 | 10/2002 | Li et al. | |
| 2004/0257879 A1 | 12/2004 | Yang et al. | |
| 2005/0207225 A1* | 9/2005 | Chen et al. | 365/185.17 |
| 2006/0114719 A1* | 6/2006 | Lee | 365/185.17 |
| 2007/0236994 A1 | 10/2007 | Hsu et al. | |

OTHER PUBLICATIONS

International Search Report from PCT/KR2009/005098 dated Apr. 1, 2010 (4 pages).
Written Opinion from PCT/KR2009/005098 dated Apr. 1, 2010 (4 pages).

* cited by examiner

*Primary Examiner* — Huan Hoang
(74) *Attorney, Agent, or Firm* — Sughrue Mion, PLLC

(57) ABSTRACT

A flash memory using hot carrier injection and a method of operating the same are provided. A plurality of strings constituting a page are formed on a single p-well and share the p-well. During a program operation, a string selection transistor is turned off, and electrons are accumulated in a source or drain region in response to a bias voltage applied to the p-well. Thereafter, the accumulated electrons are trapped in a charge trap layer of a memory cell in response to a program voltage applied through a word line. Also, during an erase operation, holes accumulated in response to a bias voltage applied to the p-well are trapped in the charge trap layer in response to an erase voltage. The flash memory performs NAND-type program and erase operations using hot carrier injection.

3 Claims, 9 Drawing Sheets

Fig. 2
(RELATED ART)
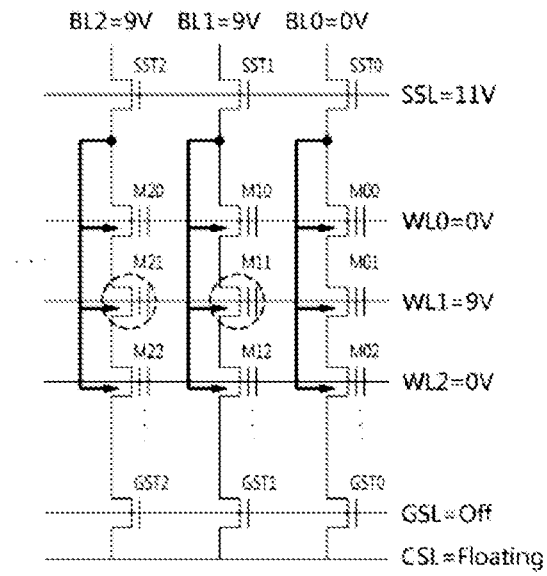
PROGRAM OPERATION
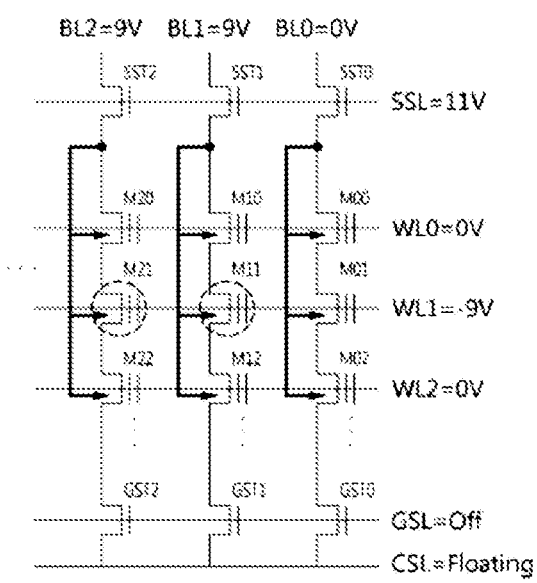
ERASE OPERATION

Fig. 3 (RELATED ART)
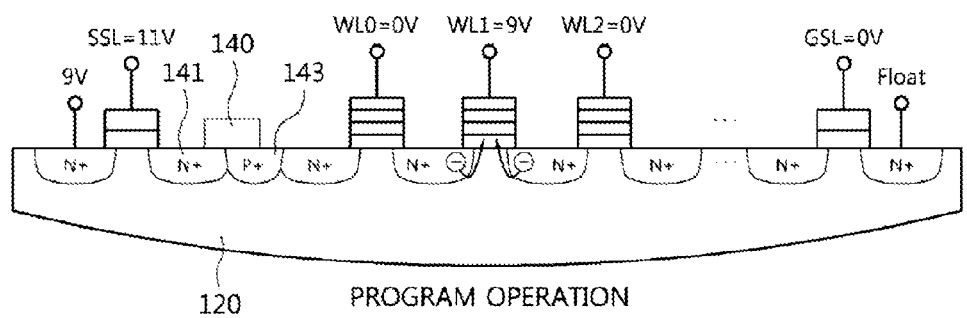
PROGRAM OPERATION
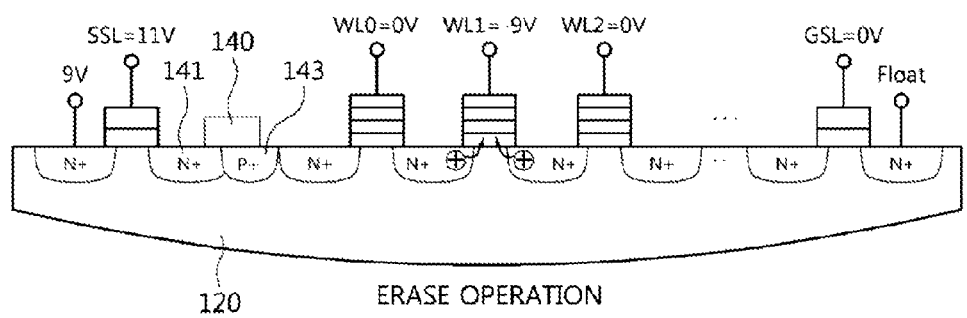
ERASE OPERATION

NAND FLASH MEMORY OF USING COMMON P-WELL AND METHOD OF OPERATING THE SAME

TECHNICAL FIELD

The present invention relates to a nonvolatile memory, and more particularly, to a NAND flash memory and a method of operating the same.

BACKGROUND ART

A nonvolatile memory retains stored data without deleting the stored data even when power supply is interrupted. A flash memory, which is a typical nonvolatile memory, includes two gate layers stacked in a single cell transistor. The gate layers are called a floating gate and a control gate.

Typical operations of a flash memory may be divided into a program operation, an erase operation, and a read operation.

The program operation includes trapping electrons in a floating gate, thus resulting in an increase in threshold voltage of a cell transistor. Also, the erase operation includes transporting charges trapped in the floating gate to a channel region or source and drain regions. The erase operation may result in a decrease in threshold voltage of the cell transistor.

That is, a data storage type of a flash memory may be embodied by variations in threshold voltage. Also, in order to enable a program or erase operation, charges should pass through a tunneling oxide layer disposed between a channel region and a floating gate. This may be accomplished by Fowler-Nordheim (F-N) tunneling or hot carrier injection.

F-N tunneling refers to transportation of charges due to a difference between a voltage of a bulk region disposed under a channel and a voltage of a floating gate. Also, hot carrier injection refers to a phenomenon in which charges accelerated due to a voltage difference in a source or drain region pass through a tunneling oxide layer due to a voltage applied to a control gate.

An F-N tunneling operation may be disadvantageous in terms of an operating time. In particular, since a NAND flash memory performs program and erase operations through F-N tunneling, the NAND flash memory operates at a lower speed than a NOR memory. However, despite the low operating speed, the NAND flash memory is appropriate for storage of voice or image data because the NAND flash memory is capable of reading data in page units.

In recent years, techniques on flash memory devices in which cells are disposed as NAND types and perform NOR-type operations have been proposed as exemplarily disclosed in U.S. Patent Publication No. 2007-236994. Hereinafter, the technique disclosed in U.S. Patent Publication No. 2007-236994 will be referred to as a conventional art.

FIG. 1 is a cross-sectional view illustrating program and erase operations of a conventional memory cell.

Referring to FIG. 1, the memory cell includes a source region 100 and a drain region 110 formed on both sides of a channel region and a gate structure 130 formed on the channel region.

The gate structure 130 includes a tunneling oxide layer 131, a charge trap layer 133, a blocking insulating layer 135, and a gate electrode 137. Also, the source and drain regions 100 and 110 are heavily doped with n+impurity ions, and a p-well 120 is formed outside the source and drain regions 100 and 110. Thus, a p-n junction is formed between the p-well 120 and the source and drain regions 100 and 110, and a depletion region is formed at an interface of the p-n junction. Also, when an additional bias voltage is not applied to the source region 100 or the drain region 110, a built-in voltage Vbi is generated across the depletion region.

The program operation of the memory cell having the above-described structure will now be described. To begin with, a voltage Vg of 0 V is applied to the gate electrode 137, and a voltage of 9 V is applied to the p-well 120. A voltage of 9-Vbi is applied to a portion of the source or drain region 100 or 110 adjacent to the depletion region due to the voltage of 9 V applied to the p-well 120.

Thereafter, a voltage of 0 V is applied to the p-well 120, and a voltage Vg of 9 V is applied to the gate electrode 137. Since the voltage of 9-Vbi was applied to the source or drain region 100 or 110 and the voltage of 0 V was applied to the p-well 120 under previous bias conditions, a reverse bias voltage is applied to the p-n junction between the p-well 120 and the source and drain regions 100 and 110. Thus, due to the reverse bias voltage, electrons of the source or drain region 100 or 110 may overcome a potential bather between the source or drain region 100 or 100 and the depletion region and move to the channel region.

Also, the electrons in the channel region may pass through the tunneling oxide layer 131 due to the voltage Vg of 9 V applied to the gate electrode 137 and may be trapped in the charge trap layer 133.

During the erase operation, the memory cell performs a complementary operation to the program operation. To begin with, a voltage Vg of 0 V is applied to the control gate 137, and a voltage of 9 V is applied to the p-well 120. Thus, a voltage of 9V-Vbi is applied to the portion of the source or drain region 100 or 110 adjacent to the depletion region.

Subsequently, a voltage of 0 V is applied to the p-well 120, and a voltage Vg of −9 V is applied to the gate electrode 137. Due to the bias voltage of 0 V applied to the p-well 120, a reverse bias voltage is applied between the source and drain regions 100 and 110 and the p-well 120. Also, due to the voltage Vg of −9 V applied to the control gate 137, holes are trapped in the charge trap layer 133 across the channel region, thereby enabling the erase operation.

FIG. 2 is a circuit diagram of a conventional flash memory performing program and erase operations.

Referring to FIG. 2, a bias voltage is applied to a p-well of a memory cell during a program operation in response to string selection transistors SST0, SST1, and SST2 being turned on.

For example, a voltage of 9 V is applied to bit lines BL1 and BL2 of the string selection transistors SST1 and SST2 included in a selected string, while a voltage of 0 V is applied to a bit line BL0 of an unselected string. Also, a voltage of 11 V is applied to a string selection line SSL.

Accordingly, the string selection transistors SST0, SST1, and SST2 are turned on, a voltage of 9 V is transmitted to first terminals of memory cells M10 and M20 of the selected strings, and a voltage of 0 V is transmitted to a first terminal of a memory cell M00 of the unselected string. In addition, the voltages transmitted to the bit lines BL0, BL1, and BL2 through the string selection transistors SST0, SST1, and SST2 are electrically transmitted to p-wells of memory cells.

Furthermore, a voltage of 9 V is applied to a word line WL1 of memory cells M11 and M21, which are programmed in the selected string. That is, the voltage of 9 V is transmitted through the word line WL1. Conversely, a voltage of 0 V is applied to word lines WL0 and WL2 of the remaining memory cells, which are not programmed.

When selected memory cells are erased, a voltage of −9 V is transmitted through the word line WL1 so that an erase operation may be performed as shown in FIG. 2. Thus, the selected memory cells M11 and M21 may be discretely erased.

In other words, the flash memory of FIG. 2 may discretely select and program a memory cell and discretely select and erase a memory cell. That is, the flash memory of FIG. 2 may perform a NOR-type operation during program and erase operations.

It can be seen that although the circuit of FIG. 2 is configured to be a NAND type, the circuit of FIG. 2 may substantially perform a NOR-type operation during program and erase operations.

FIG. 3 shows cross-sectional views of a string structure of the circuit of FIG. 2.

Referring to FIG. 3, a butting contact 140 should be included to enable the operations of FIG. 2.

Specifically, in order to supply a bias voltage from a bit line BL through a string selection transistor SST to a p-well 120, the flash memory should include the butting contact 140 formed of a conductive metal on the surface of a substrate. This is because, since the string selection transistor SST is an n type and memory cells are n-types, the bias voltage cannot be directly transmitted to the p-well 120. That is, an ohmic contact is required to transmit the bias voltage to the p-well 120, and the bias voltage should be transmitted through an additional p-type doped region to be in ohmic contact with the p-well 120.

Thus, the conductive butting contact 140 is disposed on an n+doped region 141, which is an output terminal of the string selection transistor SST, and a p+ doped region 143 is disposed under one terminal of the butting contact 140.

The above description should be applied likewise to an erase operation.

FIG. 4 illustrates the layout of the circuit of FIG. 2, which is formed on a semi-conductor substrate.

Referring to FIG. 4, each of strings 150 defines an active region and includes a p-well 120 surrounding the active region. Also, a p+ doped region 143 is disposed on one side of a string selection line SSL, and a butting contact 140 is disposed on the p+ doped region 143. Respective memory cells are defined by word lines WL0, . . . , and WL7, which are disposed across the active region, and n+doped regions disposed on both sides of the word lines WL0, . . . , and WL7. It may be understood that the word lines WL0, . . . , and WL7 are equivalent to the gate electrode of FIG. 1.

The above-described structure may embody NOR-type operations without using F-N tunneling. However, the above-described structure should include the butting-contact 140 to apply a bias voltage to the p-well 120. Also, each of the strings 150 should include an additional p-well 120.

Due to the butting contact 140 included in each of the strings 150, the memory area of each page should be increased, and an additional fabrication process should be performed. That is, the burden of an additional process of forming the butting contact 140 is increased. Also, since the additional p-well 120 should be formed in each of the strings 150, there is a deviation in dopant concentration of the p-well 120 in the strings 150.

When the deviation in dopant concentration of the p-wells 120 occurs, even if a program voltage is applied to a single word line, there may be a deviation between program and erase intensities of a memory cell connected to the word line. In other words, even if a voltage is applied to the same word line, the deviation in dopant concentration of the p-wells 120 may lead to a deviation in threshold voltage of the memory cell.

DISCLOSURE OF INVENTION

Technical Problem

The present invention is directed to a flash memory that employs hot carrier injection using a reverse bias voltage and shares a single p-well between a plurality of strings.

Also, the present invention is directed to a method of operating the above-described flash memory.

Solution to Problem

One aspect of the present invention provides a flash memory including a p-well region and a plurality of strings formed on the p-well region. Each of the strings includes a plurality of memory cells connected in series. The plurality of memory cells are formed on the p-well region and share the p-well region. The memory cells are selectively programmed in response to a program voltage applied to a selected string, and all memory cells constituting a single page are erased in response to an erase voltage applied through a word line.

Another aspect of the present invention provides a method of programming a flash memory. The flash memory includes a plurality of strings, each of which includes a string selection transistor electrically connected to a bit line, memory cells electrically connected to the string selection transistor, and a ground selection transistor electrically connected to the memory cells. The method includes: accumulating electrons in a source or drain region of the memory cell by applying a body voltage to a single p-well region formed under the plurality of strings; and trapping the accumulated electrons in a charge trap layer of the memory cell by applying a program voltage to a specific word line.

Yet another aspect of the present invention provides a method of erasing a flash memory. The flash memory includes a plurality of strings, each of which includes a string selection transistor electrically connected to a bit line, memory cells electrically connected to the string selection transistor, and a ground selection transistor electrically connected to the memory cells. The method includes: accumulating holes in a source or drain region of the memory cell by applying a body voltage to a single p-well region formed under the plurality of strings; and trapping the accumulated holes in a charge trap layer of the memory cell by applying an erase voltage to all word lines.

Advantageous Effects of Invention

According to the present invention, a flash memory performs NAND-type operations. A plurality of strings are disposed in a single p-well, and a bias voltage is applied to the p-well to accumulate charges in memory cells constituting the strings. The flash memory includes neither an additional p+ region nor a butting contact for the bias voltage applied to the p-well. Thus, the efficiency of a fabrication process can be enhanced. Also, since the flash memory performs program and erase operations using hot carrier injection, the operating speed of the NAND flash memory can be improved.

BRIEF DESCRIPTION OF DRAWINGS

FIG. 2 is a circuit diagram of a conventional flash memory performing program and erase operations.

FIG. 3 shows cross-sectional views of a string structure of the circuit of FIG. 2.

MODE FOR THE INVENTION

Figure 1:
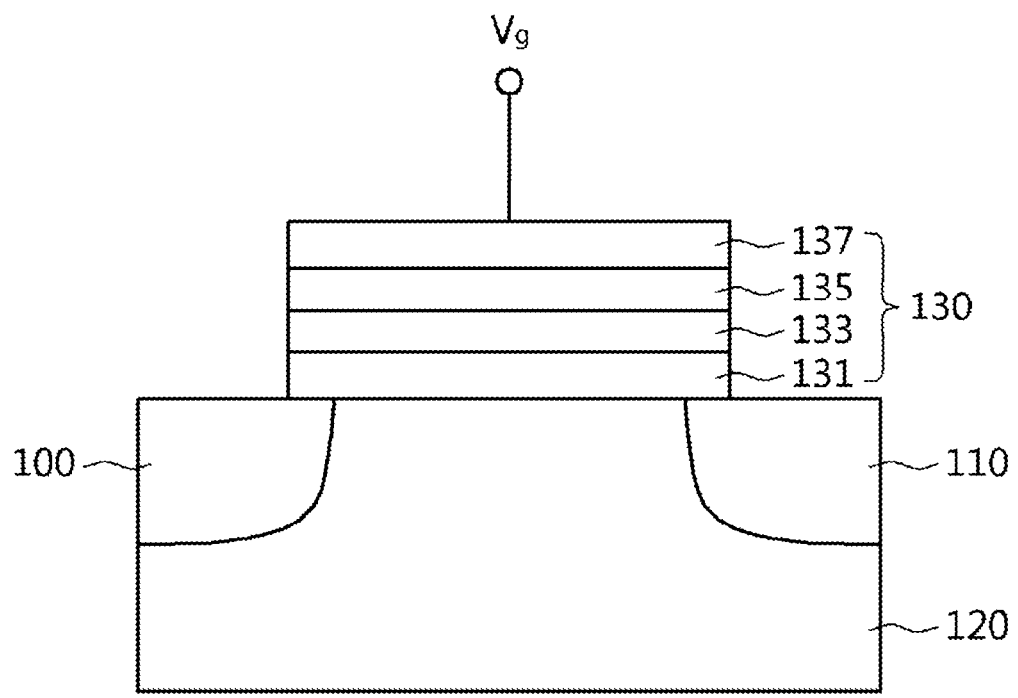
FIG. 1 is a cross-sectional view illustrating program and erase operations of a conventional memory cell.
Figure 4:
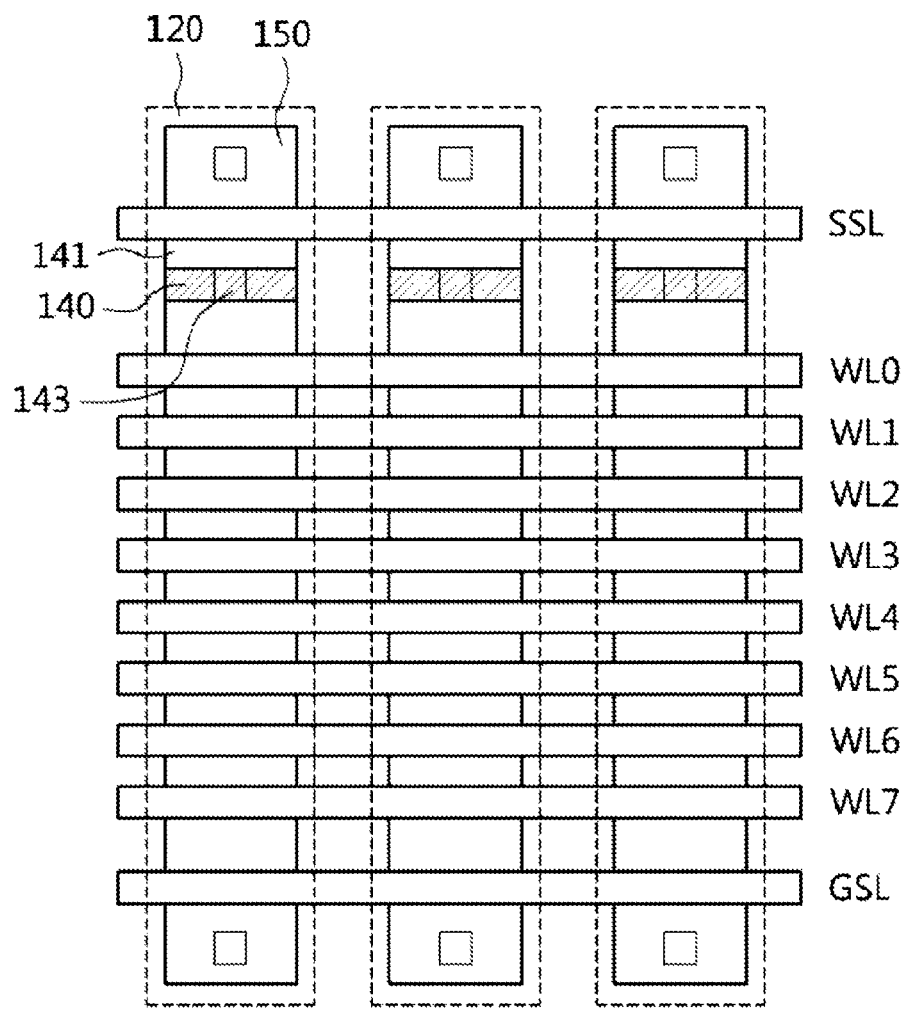
FIG. 4 illustrates the layout of the circuit of FIG. 2, which is formed on a semi-conductor substrate.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention. Like reference numerals in the drawings denote like elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

The present invention will now be described more fully with reference to the accompanying drawings, in which exemplary embodiments of the invention are shown.

Embodiment

Figure 5:
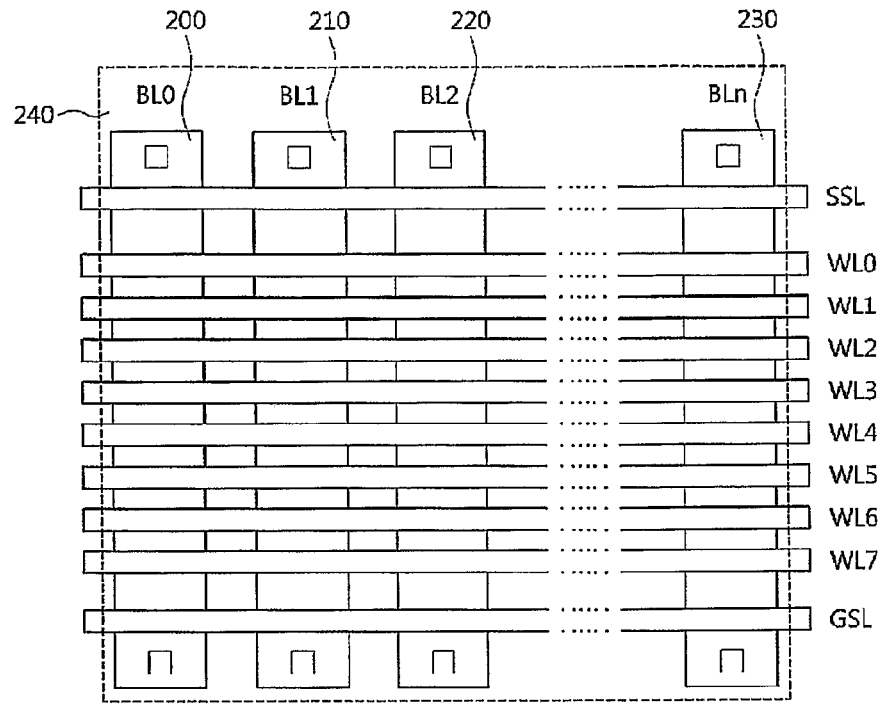
FIG. 5 illustrates the layout of a flash memory according to an exemplary embodiment of the present invention.

FIG. 5 illustrates the layout of a flash memory according to an exemplary embodiment of the present invention.

Referring to FIG. 5, the flash memory of the present embodiment has a NAND-type structure. Also, to enable the operation of the NAND-type flash memory, a single p-well 240 is shared by a plurality of strings 200, 210, 220, and 230 that constitute a page. As the p-well 240 is shared by the strings 200, 210, 220, and 230, a memory cell may be selected and programmed, and all memory cells included in a page may be erased simultaneously. In other words, a program operation may be discretely performed for each of the memory cells, while an erase operation may be performed in page units.

To begin with, the flash memory of the present embodiment includes a plurality of strings 200, 210, 220, and 230. Each of the strings 200, 210, 220, and 230 may include a string selection transistor, a ground selection transistor, and a plurality of memory cells. The plurality of memory cells are connected in series between the string selection transistor and the ground selection transistor. Also, the strings 200, 210, 220, 230 may be electrically connected to bit lines BL0, BL1, BL2, . . . , and BLn, respectively.

The string selection transistor includes source and drain regions disposed on both sides of a string selection line SSL and a gate. Also, the ground selection transistor includes a ground selection line GSL and source and drain regions disposed on both sides of the ground selection line GSL. Each of the memory cells includes word lines WL0, WL1, . . . , and WL7 and source and drain regions disposed on both sides of the word lines.

Also, although the present embodiment describes and illustrates 8 word lines, the present invention is not limited thereto. That is, 16 or more word lines may be provided.

The memory cells connected between the ground selection transistor and the string selection transistor are connected in series to one another. Each of the serially connected memory cells shares a source or drain region with an adjacent memory cell.

In addition, the string selection transistors included in the plurality of strings 200, 210, 220, 230 share the p-well region 240. That is, a plurality of string selection transistors are formed on the same p-well region 240. The memory cells included in the plurality of strings 200, 210, 220, and 230 are also formed on the same p-well region 240. Thus, the memory cells included in the adjacent strings 200, 210, 220, and 230 share the p-well region 240.

According to another exemplary embodiment, a plurality of p-wells may be formed to constitute a page. That is, string selection transistors included in a plurality of strings may be commonly formed on a single p-well, and memory cells included in the strings may be formed on another single p-well.

That is, a single page may include at least two p-wells separated from one another. Even if the p-wells are separated from one another, the flash memory operates in the same manner as the components of FIG. 5. Thus, operations of the components of FIG. 5 will now be mainly described. However, it should be noted that the substantial scope of the invention is to provide a memory device in which memory cells included in adjacent strings share a single p-well to perform a NAND flash operation.

Figure 6:
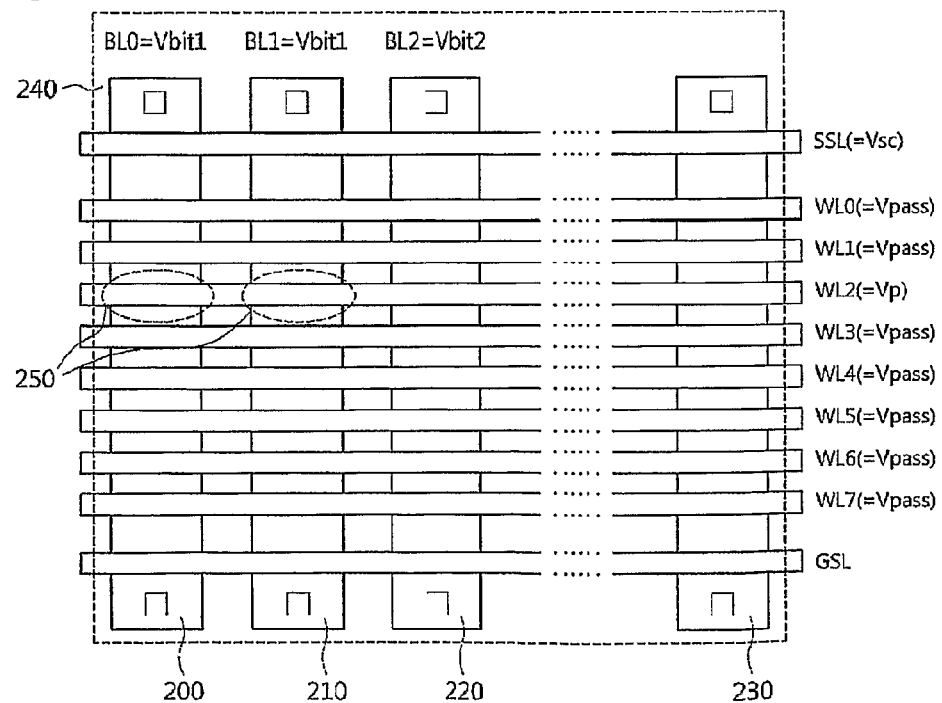
FIG. 6 illustrates the layout of a flash memory for explaining a program operation according to an exemplary embodiment of the present invention.

FIG. 6 illustrates the layout of a flash memory for explaining a program operation according to an exemplary embodiment of the present invention.

Referring to FIG. 6, a first bit line voltage Vbit 1 is applied through bit lines BL0 and BL1 to selected first and second strings 200 and 210, and a second bit line voltage Vbit2 is applied through a bit line BL2 to an unselected third string 220. The first bit line voltage Vbit1 may be higher than the second bit line voltage Vbit2.

Thus, it may be determined in FIG. 6 that the first bit line voltage Vbit1 is a positive power supply voltage Vdd, and the second bit line voltage Vbit2 is a ground voltage of 0 V.

Furthermore, a string control voltage Vsc is applied to a string selection line SSL for controlling on/off operations of a string selection transistor. When the string control voltage Vsc is equal to or lower than the first bit line voltage Vbit 1 or the second bit line voltage Vbit2, the string selection transistor of the corresponding string is turned off. Also, when the string control voltage Vsc is higher than the first bit line voltage Vbit1 or the second bit line voltage Vbit2 by at least a threshold voltage, the corresponding string selection transistor is turned on.

In FIG. 6, the string selection transistors of the selected first and second strings 200 and 210 are turned off, while the string selection transistor of the unselected third string 220 is turned on. Thus, the string selection transistor is turned on or off in response to the level of the string control voltage Vsc.

Accordingly, the string selection transistors of the selected first and second strings 200 and 210 are turned off, while the string selection transistor of the unselected third string 220 is turned on.

Also, a program voltage Vp is applied to a selected word line WL2, and a pass voltage Vpass is applied to the unselected remaining word lines. It may be determined that the program voltage Vp is higher than the pass voltage Vpass. Also, the program voltage Vp should be set to such a level as to cause hot carrier injection in a memory cell. A voltage for causing hot carrier injection depends on the dopant concentration of a memory cell, the composition of a gate structure, and the thickness of a thin layer. However, the program voltage Vp may be higher than the positive power supply voltage Vdd.

A program operation is performed in response to the program voltage Vp applied to a selected memory cell 250 of the selected first and second strings 200 and 210. During the program operation, electrons in a source or drain region of the selected memory cell 250 are trapped in a charge trap layer, and a threshold voltage is varied.

On the other hand, even if the program voltage Vp is applied to a memory cell of the unselected third string 220, no program operation is performed. This is because the string selection transistor of the unselected third string is turned on, and memory cells connected to an unselected word line are turned on in response to the voltage Vpass applied to the unselected word line. That is, a bias voltage applied through the turned-on memory cells and a bit line may be transmitted to the memory cell to which the program voltage Vp is applied. Specifically, the second bit line voltage Vbit2 of 0 V is transmitted through the bit line to the memory cell to which the program voltage Vp is applied. Thus, a bias voltage of 0 V is substantially applied to a source or drain region of the memory cell connected to a word line to which the program voltage Vp is applied, so that no charges may be accumulated adjacent to a depletion region between the p-well 240 and the source and drain regions. As a result, the trapping of electrons does not occur with the application of the program voltage Vp.

Figure 7:
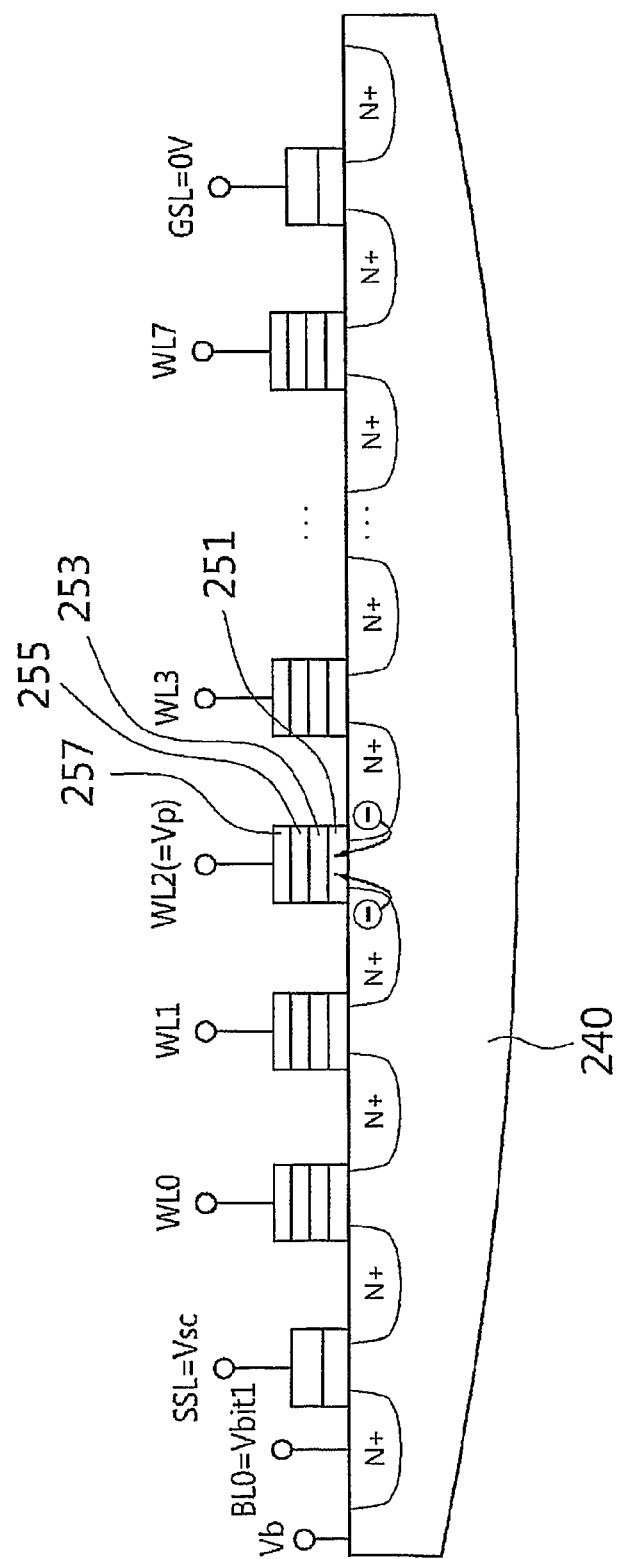
FIG. 7 is a cross-sectional view of a first string of the flash memory of FIG. 6, according to an exemplary embodiment of the present invention.

FIG. 7 is a cross-sectional view of the first string of the flash memory of FIG. 6, according to an exemplary embodiment of the present invention.

Referring to FIG. 7, a plurality of n+ heavily doped regions are disposed on the p-well 240, and a gate structure is disposed between the n+ heavily doped regions. Also, a string selection transistor is disposed to be electrically connected to the bit line BL0 and connected to a memory cell. The first bit line voltage Vbit1 is applied to the bit line BL0, and each of the memory cells shares source and drain regions with an adjacent memory cell in the same string and is electrically connected to a common source line through a ground selection transistor.

In addition, each of the memory cells includes a tunneling oxide layer 251, a charge trap layer 253, a blocking oxide layer 255, and a gate electrode 257.

In the selected first string, the string selection transistor is turned off in response to the string control voltage Vsc applied through the string selection line SSL. The string control voltage Vsc for turning off the string selection transistor is controlled to be lower than Vbit 1+Vth (here, Vth is a threshold voltage of the string selection transistor). Also, the ground selection transistor is also turned off in response to a voltage applied through the ground selection line GSL.

The program operation will now be described. Initially, a low-level voltage is applied to a word line WL2 of a selected memory cell, and a high-level body bias voltage Vb is applied to the p-well 240. For example, a low-level voltage of 0 V is applied to the word line WL2, and a high-level voltage of 9 V is applied to the p-well 240. Electrons are accumulated in the source or drain region, which is an n+ region, in response to the voltage applied to the p-well 240.

Subsequently, the body bias voltage Vb applied to the p-well 240 is controlled to be at a low or ground level, and a program voltage Vp is applied to the word line WL2 of the selected memory cell. In response to the applied program voltage Vp, the electrons accumulated in the source or drain region move to a channel region, pass through the tunneling oxide layer 251, and are trapped in the charge trap layer 253.

Figure 8:
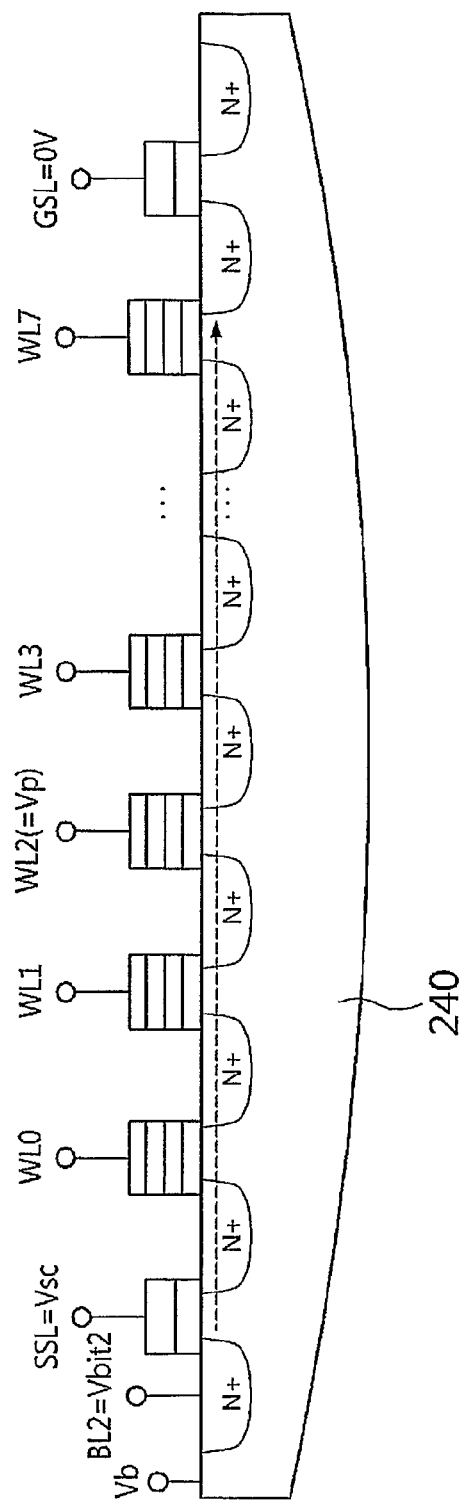
FIG. 8 is a cross-sectional view of a third string of the flash memory of FIG. 6.

FIG. 8 is a cross-sectional view of the third string of the flash memory of FIG. 6, according to an exemplary embodiment of the present invention.

Referring to FIG. 8, in the third string, the string selection transistor is turned on in response to the string control voltage Vsc applied to the string selection line SSL and the second bit line voltage Vbit2 applied to the bit line BL2. The second bit line voltage Vbit2 is transmitted through the turned-on string selection transistor to turned-on memory cells.

That is, source and drain regions of the memory cell are biased to the second bit line voltage Vbit2.

Even if the program voltage Vp is applied to the unselected third string, a program operation is not performed. That is, a low-level voltage is applied from the bit line BL2 to the unselected third string, and the string selection transistor is turned on in response to the string control voltage Vsc. The low-level voltage of the bit line BL2 is transmitted through the turned-on string selection transistor to the source or drain region of the memory cell.

Also, the memory cell of the third string performs only a turn-on operation in response to the pass voltage Vpass and the program voltage Vp, which are applied through the word lines. For example, even if a high-level voltage is applied to the p-well 240 and a low-level voltage is applied to the word line WL2 of the selected memory cell to accumulate electrons in the source or drain region of the selected memory cell, the low-level voltage applied from the bit line BL2 through the turned-on string selection transistor prevents accumulation of charges at an interface between the p-well 240 and the source or drain region. Also, even if a low-level voltage is applied to the p-well 240 and the program voltage Vp is applied to the word line WL2 of the selected memory cell, the turned-on string selection transistor and the low-level voltage transmitted from the bit line BL2 through the turned-on string selection transistor to the memory cell prevent movement of charges due to reverse biasing. In other words, even if the program voltage Vp is applied, no program operation occurs.

Figure 9:
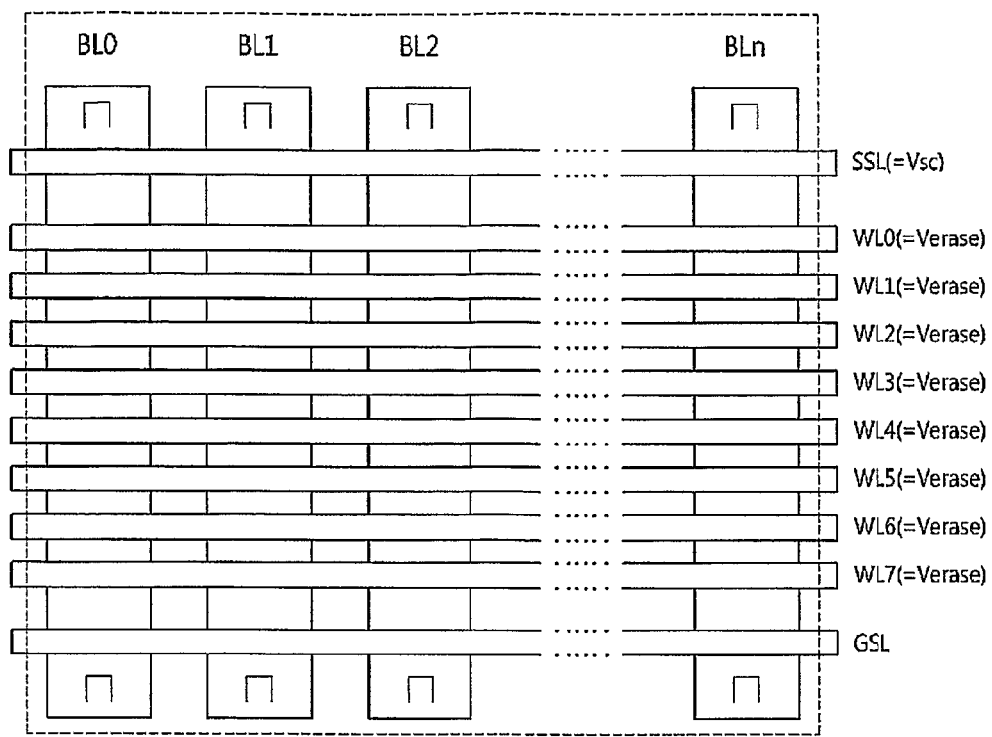
FIG. 9 illustrates the layout of a flash memory for explaining an erase operation according to an exemplary embodiment of the present invention.

FIG. 9 illustrates the layout of a flash memory for explaining an erase operation according to an exemplary embodiment of the present invention.

The flash memory according to the present embodiment is structurally the same as shown in FIG. 6 except that all memory cells included in a page may be erased during an erase operation. In other words, all memory cells may be erased simultaneously due to a bias voltage applied through word lines of the memory cells.

Referring to FIG. 9, a string selection transistor is turned off in response to a bias voltage applied through a string selection line SSL and bit lines BL0, BL1, BL2, . . . , and BLn. Also, an erase voltage Verase is applied to word lines WL0, WL1, . . . , and WL7 of all the memory cells. All the memory cells included in the page may be erased simultaneously in response to the applied erase voltage Verase.

Figure 10:
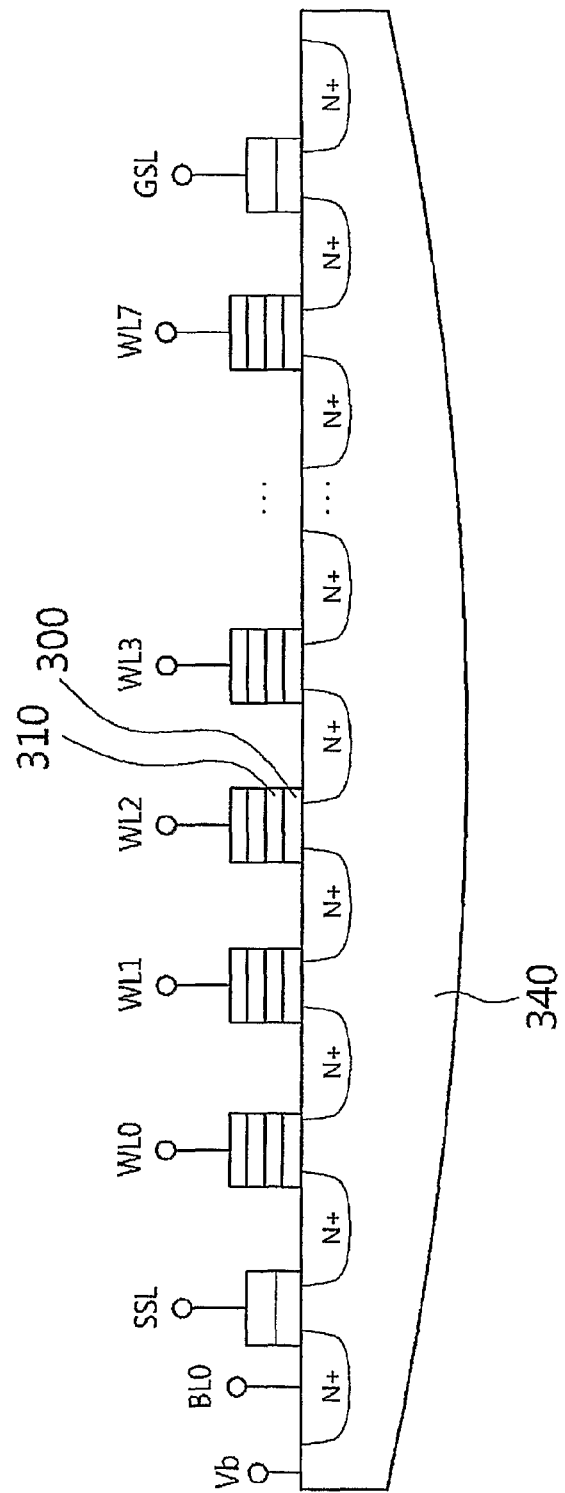
FIG. 10 is a cross-sectional view of one string of the flash memory of FIG. 9, according to an exemplary embodiment of the present invention.

FIG. 10 is a cross-sectional view of one string of the flash memory of FIG. 9, according to an exemplary embodiment of the present invention.

Referring to FIG. 10, initially, a high-level body voltage Vb is applied to a p-well 340, and a low-level voltage is applied to the word lines WL0, WL1, ..., and WL7 of the memory cell. Thus, charges are accumulated in a source or drain region that is heavily doped with n+ impurity ions, so that the source or drain region may have an electrical potential lower than the body voltage Vb by a built-in voltage Vblt of a p-n junction.

Subsequently, the erase voltage Verase is applied to all the word lines WL0, WL1, WL2, ..., and WL7 of the memory cell, and a ground voltage is applied to the p-well 340. The erase voltage Verase may be lower than the ground voltage. Thus, a negative voltage may be applied as the erase voltage Verase.

However, the level of the erase voltage Verase may be varied according to the dopant concentration, the layer thickness of a gate structure, and the composition of the gate structure during a fabrication process. The erase voltage Verase, which is varied according to the thickness and composition of the gate structure and the dopant concentration, should be sufficient to cause hot carrier injection of holes. Specifically, the erase voltage Verase should have a sufficient negative value and be controlled to overcome reverse biasing between the p-well 340 and the n+ heavily doped region and trap holes in a charge trap layer 310 across a tunneling oxide layer 300. Finally, when the erase voltage Verase is applied to the word lines and the ground voltage is applied to the p-well 340, a reverse bias voltage is temporarily applied between the p-well 340 and the source and drain region. Thus, holes are transported to a channel region and then moved to and trapped in the charge trap layer 310 in response to the erase voltage Verase. As a result, the erase operation is completed.

During the above-described erase operation, the p-well 340 is shared by a plurality of strings. In other words, the strings are formed on the single p-well 340. Thus, all memory cells included in a single page may be erased simultaneously in response to a variation in bias voltage applied to the p-well 340 required for an erase operation.

According to the present invention as described above, a single p-well is shared by a plurality of strings. Also, an additional butting contact is not formed on the p-well, and program and erase operations may be uniformly performed due to the shared p-well. Furthermore, a flash memory according to the present invention may perform NAND-type operations due to the shared p-well.

While the invention has been shown and described with reference to m certain exemplary embodiments thereof, it will be understood by those skilled in the art that various changes in form and details may be made therein without departing from the spirit and scope of the invention as defined by the appended claims.

The invention claimed is:

1. A flash memory comprising:
   a p-well region; and
   a plurality of strings formed on the p-well region,
   wherein each of the strings includes a plurality of memory cells connected in series, and the plurality of memory cells are formed on the p-well region and share the p-well region,
   wherein the memory cells are configured to be selectively programmed in response to a program voltage applied to a selected string and a body bias voltage independently connected to the p-well region, and all memory cells constituting a single page are configured to be erased in response to an erase voltage applied through a word line and the body bias voltage,
   wherein each of the strings comprises a string selection transistor electrically connected to a bit line, the memory cells are electrically connected to the string selection transistor, and a ground selection transistor is electrically connected to the memory cells,
   wherein the flash memory is configured such that, during a program operation, the string selection transistor is turned off, and electrons accumulated in response to the body bias voltage applied to the p-well are injected by performing hot carrier injection in response to the program voltage applied through the word line, and
   wherein the flash memory is further configured such that, during an erase operation, holes accumulated in response to the body bias voltage applied to the p-well are injected by performing hot carrier injection in response to the erase voltage applied through the word line.

2. A method of programming a flash memory, comprising a plurality of strings, each string including a string selection transistor electrically connected to a bit line, memory cells electrically connected to the string selection transistor, and a ground selection transistor electrically connected to the memory cells, the method comprising:
   accumulating electrons in a source or drain region of the memory cell by applying a body bias voltage independently constituted from the bit line and a word line to a single p-well region formed under the plurality of strings; and
   trapping the accumulated electrons in a charge trap layer of the memory cell by applying a program voltage to a specific word line
   wherein the accumulating the electrons comprises setting the string selection transistor and the ground selection transistor to a turned-off state, and setting other memory cells connected to the programmed memory cell to a turned-on state.

3. The method according to claim 2, wherein string selection transistors of strings other than the programmed string are turned on.

* * * * *